(12) United States Patent
Byun et al.

(10) Patent No.: US 11,611,397 B1
(45) Date of Patent: Mar. 21, 2023

(54) OPTICAL MODULATING DEVICE AND APPARATUS INCLUDING THE SAME

(71) Applicant: SAMSUNG ELECTRONICS CO., LTD., Suwon-si (KR)

(72) Inventors: Hyunil Byun, Seongnam-si (KR); Dongjae Shin, Seoul (KR); Changgyun Shin, Anyang-si (KR); Inoh Hwang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/699,553

(22) Filed: Mar. 21, 2022

(30) Foreign Application Priority Data

Oct. 6, 2021 (KR) ................. 10-2021-0132709

(51) Int. Cl.
*H04B 10/548* (2013.01)
*H04B 10/50* (2013.01)

(52) U.S. Cl.
CPC ......... *H04B 10/548* (2013.01); *H04B 10/501* (2013.01)

(58) Field of Classification Search
None
See application file for complete search history.

(56) References Cited

U.S. PATENT DOCUMENTS

| | | | |
|---|---|---|---|
| 6,708,003 B1 * | 3/2004 | Wickham | H04B 10/1121 398/161 |
| 10,283,931 B2 | 5/2019 | Caer et al. | |
| 10,665,609 B2 | 5/2020 | Hahn et al. | |
| 10,790,909 B1 * | 9/2020 | Suni | H04B 10/50 |
| 2009/0245298 A1 | 10/2009 | Sysak et al. | |
| 2009/0324250 A1 * | 12/2009 | Chen | H04B 10/00 398/182 |
| 2012/0229886 A1 * | 9/2012 | Chen | H04L 27/2697 359/326 |
| 2015/0316793 A1 * | 11/2015 | Ayazi | G02F 1/025 438/31 |

(Continued)

OTHER PUBLICATIONS

Wikipedia, "Phased array", https://en.wikipedia.org/wiki/Phased_array, Aug. 12, 2022. (14 pages total).

(Continued)

*Primary Examiner* — David W Lambert
(74) *Attorney, Agent, or Firm* — Sughrue Mion, PLLC

(57) ABSTRACT

Provided is an optical modulating device including a substrate including first and second trenches, a phase modulator in a region of the substrate, the phase modulator including an undoped region provided between the first and the second trenches, and first and a second doped regions which are apart from each other with the undoped region therebetween, wherein the phase modulator is configured to modulate a phase of light traveling through the undoped region based on a first electrical signal applied to the phase modulator, an amplifier including a first doped layer, a quantum well layer, a clad layer, and a second doped layer sequentially on the substrate, the amplifier overlapping at least a portion of the phase modulator and being configured to amplify the light based on a second electrical signal applied to the amplifier, and an insulating layer between the phase modulator and the amplifier.

23 Claims, 11 Drawing Sheets

(56) References Cited

U.S. PATENT DOCUMENTS

| | | | |
|---|---|---|---|
| 2016/0155884 A1* | 6/2016 | Hon | H01L 31/022416 257/184 |
| 2018/0031680 A1* | 2/2018 | Lee | G01S 7/4817 |
| 2021/0149227 A1 | 5/2021 | Lee et al. | |

OTHER PUBLICATIONS

Connelly, Michael J., "Wideband Semiconductor Optical Amplifier Steady-State Numerical Model", IEEE Journal of Quantum Electronics, vol. 37, No. 3, Mar. 2001, pp. 439-447. (9 pages total).
Communication dated Oct. 5, 2022, issued by the European Patent Office in European Application No. 22165921.2.
Hulme et al., "Fully integrated hybrid silicon free-space beam steering source with 32 channel phased array," Proceedings of SPIE, vol. 8989, pp. 898907-1 to 898907-15, Mar. 2014, XP060035951.
Kurczveil et al., "An Integrated Hybrid Silicon Multiwavelength AWG Laser," IEEE Journal of Selected Topics in Quantum Electronics, vol. 17, No. 6, pp. 1521-1527, Mar. 14, 2011, XP011477863.
Kim et al., "Heterogeneously-Integrated Optical Phase Shifters for Next-Generation Modulators and Switches on a Silicon Photonics Platform: A Review," Micromachines 2021, vol. 12, No. 625, Jan. 2021, Total 19 pages, XP055911583.

* cited by examiner

| | COMPARATIVE EXAMPLE | EMBODIMENT |
|---|---|---|
| input | 0.1mW | 0.1mW |
| output (signal) | 6.47mW | 6.03mW (0.3dB↓) |
| output (noise) | 0.54mW | 0.26mW (3.2dB↓) |
| SNR | 10.8dB | 13.7dB (2.9dB↑) |

WAVELENGTH 1310nm, LOSS BY COMPOUND SEMICONDUCTOR 6200/cm,
LOSS BY PHASE MODULATION 965/cm,
INJECTION CURRENT 100mA, L2=L3=700um ASSUMED

OPTICAL MODULATING DEVICE AND APPARATUS INCLUDING THE SAME

CROSS-REFERENCE TO RELATED APPLICATION

This application is based on and claims priority under 35 U.S.C. § 119 to Korean Patent Application No. 10-2021-0132709, filed on Oct. 6, 2021, in the Korean Intellectual Property Office, the disclosure of which is incorporated by reference herein in its entirety.

BACKGROUND

1. Field

Example embodiments of the present disclosure relate to an optical modulating device and an apparatus including the optical modulating device.

2. Description of Related Art

Light detection and ranging (LiDAR) systems are used in various fields such as aerospace, geology, 3D maps, automobiles, robots, drones, and the like.

LiDAR systems use a time-of-flight (TOF) method as a basic operating principle. That is, LiDAR systems measure a time of flight with a high-speed electric circuit by emitting light toward an object and receiving light returning from the object, by using a sensor. The distance to the object may be calculated from the measured time of flight. A depth image of the object may be processed using a distance calculated for each position of the object.

There are various types of LiDAR sensors depending on measurement methods, laser types, detection methods, etc., and research into a method of reducing optical loss in LiDAR sensors has been conducted.

SUMMARY

One or more example embodiments provide optical modulating devices configured to reduce optical loss, and apparatuses including the optical modulating devices.

One or more example embodiments also provide compact optical modulating devices configured to simultaneously perform optical phase modulation and amplification, and apparatuses including the optical modulating devices.

Additional aspects will be set forth in part in the description which follows and, in part, will be apparent from the description, or may be learned by practice of the presented example embodiments.

According to an aspect of an example embodiment, there is provided an optical modulating device including a substrate including a first trench and a second trench which are spaced apart from each other, a phase modulator provided in a region of the substrate, the phase modulator including an undoped region which is not doped with a dopant and provided between the first trench and the second trench, and a first doped region and a second doped region which are apart from each other with the undoped region therebetween, the first doped region and the second doped region being doped with a dopant, wherein the phase modulator is configured to modulate a phase of light traveling through the undoped region based on a first electrical signal applied to the phase modulator, an amplifier including a first doped layer, a quantum well layer, a clad layer, and a second doped layer which are sequentially provided on the substrate, the amplifier overlapping at least a portion of the phase modulator in a thickness direction of the substrate and being configured to amplify the light based on a second electrical signal applied to the amplifier, and an insulating layer between the phase modulator and the amplifier.

The phase modulator and the amplifier may be respectively configured to modulate the phase of the light based on the first electrical signal and amplify the light based on the second electrical signal simultaneously.

The amplifier entirely may overlap the phase modulator in the thickness direction of the substrate.

The first doped layer may be provided on the first trench, the undoped region, and the second trench.

The insulating layer may be provided between the first doped layer and the first doped region, between the first doped layer and the second doped region, and between the first doped layer and the undoped region.

The insulating layer may include a silicon oxide.

A width of the quantum well layer, a width of the clad layer, and a width of the second doped layer may be greater than a width of the undoped region.

A width of the quantum well layer, a width of the clad layer, and a width of the second doped layer may be less than a width of the first doped layer.

The first doped layer, the clad layer, the quantum well layer, and the second doped layer may include a Group III-V semiconductor compound.

The optical modulating device may further include a first electrode, a second electrode, a third electrode, and a fourth electrode which are in contact with the first doped region, the second doped region, the first doped layer, and the second doped layer, respectively.

The first electrical signal may be applied through the first electrode and the second electrode, and the second electrical signal may be applied through the third electrode and the fourth electrode.

The first electrode and the third electrode may be integrated.

The first electrode and the third electrode may be grounded.

A length of the phase modulator may be different from a length of the amplifier.

A length of the phase modulator may be less than a length of the amplifier.

The first doped region and the second doped region may be doped with different types of dopants.

The first doped region and the second doped region may be doped with one type of dopant.

The first doped layer may be doped with a first type of dopant different from a second type of dopant with which at least one of the first doped region and the second doped region is doped.

The optical modulating device may have a signal-to-noise ratio that is greater than or equal to 12 dB.

According to another aspect of an example embodiment, there is provided an optical steering apparatus including an optical splitter configured to split input light into a plurality of sub-light beams, a plurality of optical modulating devices configured to modulate at least one of a phase and a magnitude of each of the plurality of sub-light beams output from the optical splitter, and an antenna array configured to output, as light having directivity, the plurality of modulated sub-light beams output from the plurality of optical modulating devices, wherein at least one of the plurality of optical modulating devices includes a substrate including a first trench and a second trench which are spaced apart from each other, a phase modulator provided in a region of the substrate, the phase modulator including an undoped region which is not doped with a dopant and provided between the first trench and the second, and a first doped region and a second doped region which are spaced apart from each other with the undoped region therebetween, the first doped region and the second doped region being doped with a dopant, wherein the phase modulator is configured to modulate a phase of light traveling through the undoped region based on a first electrical signal applied to the phase modulator, an amplifier provided on the substrate and overlapping at least a portion of the phase modulator in a thickness direction of the substrate, the amplifier being configured to amplify the light based on a second electrical signal applied to the amplifier, and an insulating layer configured to prevent a flow of current between the phase modulator and the amplifier.

The amplifier may include a first doped layer, a quantum well layer, a clad layer, and a second doped layer, which are sequentially provided on the substrate and overlap at least a portion of the phase modulator in the thickness direction of the substrate.

The phase modulator and the amplifier may be respectively configured to modulate the phase of the light based on the first electrical signal and amplify the light based on the second electrical signal simultaneously.

The amplifier entirely may overlap the phase modulator in the thickness direction of the substrate.

According to another aspect of an example embodiment, there is provided an optical modulating device including a substrate including a first trench and a second trench which are apart from each other, a phase modulator provided in a region of the substrate, the phase modulator including an undoped region which is not doped with a dopant and provided between the first trench and the second trench, and a first doped region and a second doped region which are apart from each other with the undoped region therebetween, the first doped region and the second doped region being doped with a dopant, wherein the phase modulator is configured to modulate a phase of light traveling through the undoped region based on a first electrical signal applied to the phase modulator, an amplifier provided on the substrate and overlapping at least a portion of the phase modulator in a thickness direction of the substrate, the amplifier being configured to amplify the light based on a second electrical signal applied to the amplifier, and an insulating layer between the phase modulator and the amplifier, wherein the phase modulator and the amplifier are respectively configured to modulate the phase of the light based on the first electrical signal and amplify the light based on the second electrical signal simultaneously.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1A:
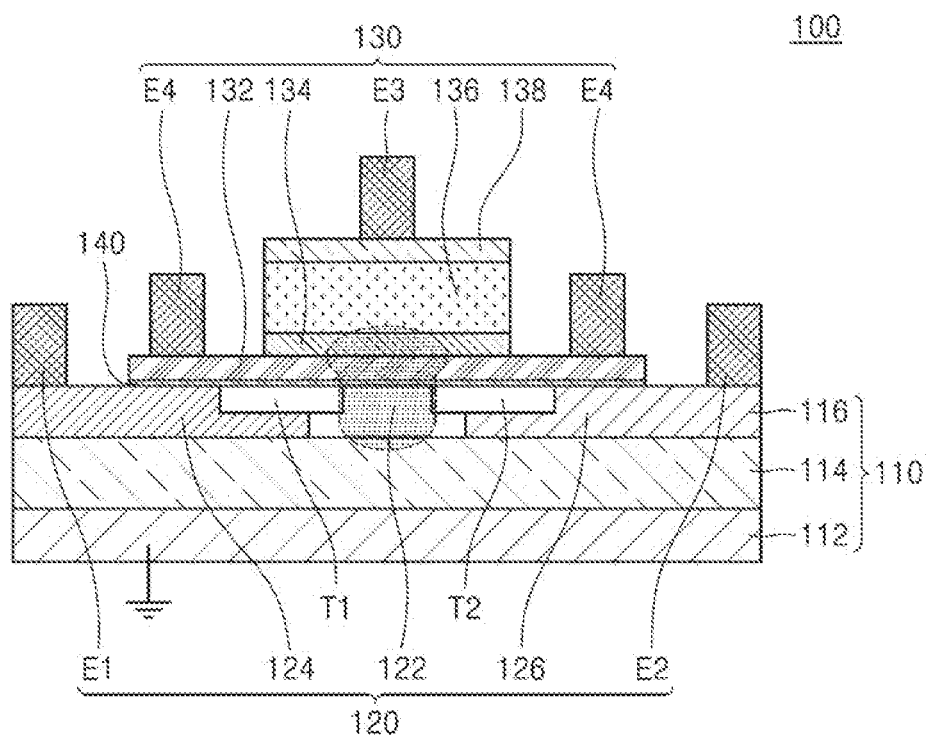
FIG. 1A is a cross-sectional view illustrating an optical modulating device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described with reference to the accompanying drawings. The example embodiments described herein are for illustrative purposes only, and various modifications may be made therein. In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element.

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "module" may be used to denote a unit that has at least one function or operation and is implemented with hardware, software, or a combination of hardware and software.

An element referred to with the definite article or a demonstrative pronoun may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the present disclosure unless defined by the claims.

Figure 1B:
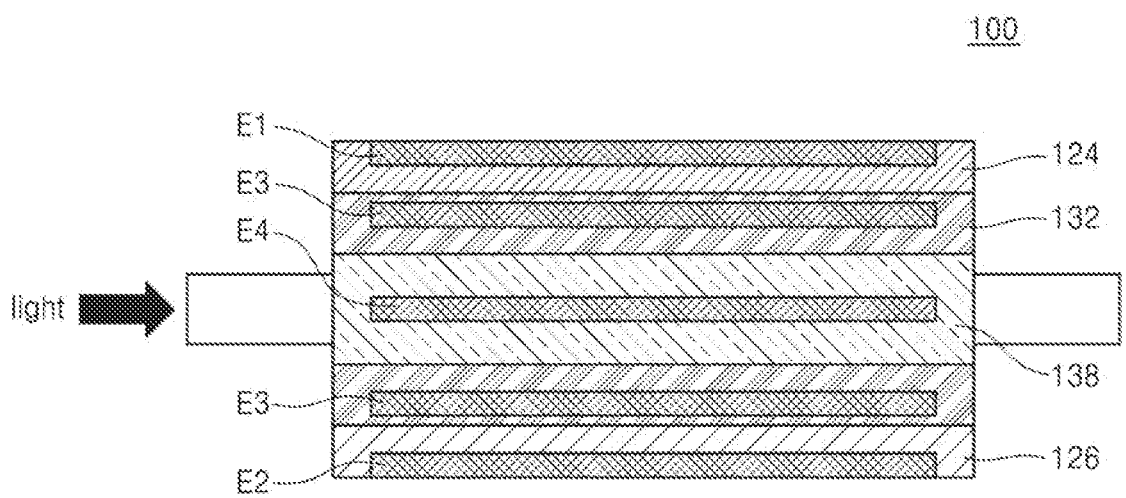
FIG. 1B is a plan view illustrating the optical modulating device shown in FIG. 1.

FIG. 1A is a cross-sectional view illustrating an optical modulating device 100 according to an example embodiment, and FIG. 1B is a plain view illustrating the optical modulating device 100 shown in FIG. 1.

Referring to FIGS. 1A and 1B, the optical modulating device 100 may include a substrate 110 including a first trench T1 and a second trench T2, a phase modulator 120 provided in a region of the substrate 110 and configured to modulate the phase of light based on a first electrical signal applied thereto, an amplifier 130 provided on the substrate 110 and overlapping at least a portion of the phase modulator 120 in the thickness direction of the substrate 110, the amplifier 130 being configured to amplify light based on a second electrical signal applied thereto, and an insulating layer 140 arranged between the phase modulator 120 and the amplifier 130. The length of the phase modulator 120 may be equal to the length of the amplifier 130.

The optical modulating device 100 may include the substrate 110, which includes the first trench T1 and the second trench T2 provided in an upper surface of the substrate 110 at a distance from each other. The substrate 110 may include a semiconductor material. For example, the substrate 110 may have a silicon-on-insulator (SOI) structure. The substrate 110 may include a first silicon layer 112, an insulating layer 114, and a second silicon layer 116. Regions of the second silicon layer 116 may be etched in the length direction of the substrate 110 to form the first trench T1 and the second trench T2.

The optical modulating device 100 may include the phase modulator 120 provided in a region of the substrate 110 and configured to modulate the phase of light based on a first electrical signal applied thereto. The phase modulator 120 may include an undoped region 122, which is not doped with a dopant and arranged between the first trench T1 and the second trench T2, and a first doped region 124 and a second doped region 126, which are doped with a dopant and arranged apart from each other with the undoped region 122 therebetween. The undoped region 122 and the first doped region 124 and the second doped region 126 may be at least some regions of the second silicon layer 116 of the substrate 110.

The undoped region 122 may be of a rib type defined by the first trench T1 and the second trench T2, and because light travels through at least a portion of the undoped region 122, the undoped region 122 may function as a waveguide.

The first doped region 124 and the second doped region 126 may be arranged apart from each other with the undoped region 122 therebetween. The first doped region 124 and the second doped region 126 may have symmetrical structures with respect to the undoped region 122. The first doped region 124 may be connected to an end of the undoped region 122 and may form the first trench T1 together with the undoped region 122. For example, the first doped region 124 may include a first region having a first thickness and being in contact with the end of the undoped region 122, and a second region having a second thickness greater than the first thickness and being in contact with the first region. The second doped region 126 may be connected to the other end of the undoped region 122 and may form the second trench T2 together with the undoped region 122. The second doped region 126 may include a third region having a third thickness and being in contact with the other end of the undoped region 122, and a fourth region having a fourth thickness greater than the third thickness and being in contact with the third region. The first thickness and the third thickness may be equal to each other, and the second thickness and the fourth thickness may be equal to each other.

The first doped region 124 and the second doped region 126 may be doped with different types of dopants. For example, the first doped region 124 may be doped with an n-type dopant, and the second doped region 126 may be doped with a p-type dopant. For example, the n-type dopant may phosphorus (P) or arsenic (As), and the p-type dopant may be boron (B). Thus, the phase modulator 120 may have a PIN diode structure. However, embodiments are not limited thereto. For example, the phase modulator 120 may have a PN structure. That is, in the second silicon layer 116, only a protruding region arranged between the first trench T1 and the second trench T2 may be an undoped region, a region lower the protruding region may be doped with an n-type dopant, and another region lower than the protruding region may be doped with a p-type dopant.

The phase modulator 120 may further include a first electrode E1, which is in contact with the first doped region 124, and a second electrode E2, which is in contact with the second doped region 126. The first electrode E1 and the second electrode E2 may be formed of a conductive material. For example, the first electrode E1 and the second electrode E2 may include at least one selected from the group consisting of titanium (Ti), gold (Au), silver (Ag), platinum (Pt), copper (Cu), aluminum (Al), nickel (Ni), and chromium (Cr), an alloy thereof, or a stack thereof. However, embodiments are not limited thereto, and in another example, the first electrode E1 and the second electrode E2 may include at least one selected from the group consisting of indium-tin-oxide (ITO), indium-zinc-oxide (IZO), Ga—In—Zn-oxide (GIZO), Al—Zn-oxide (AZO), Ga—Zn-oxide (GZO), and ZnO.

A first electrical signal may be applied through the first electrode E1 and the second electrode E2. For example, a first voltage may be applied to the second electrode E2, and the first electrode E1 may be grounded. When a first voltage is applied to the second electrode E2, current may flow in a direction from the second doped region 126 to the first doped region 124, and the refractive index of the undoped region 122 may vary according to the amount of current. When the refractive index of the undoped region 122 varies, the phase of light traveling through the undoped region 122 may vary. Therefore, the phase of light may be controlled by adjusting the magnitude of an applied electrical signal.

The optical modulating device 100 may further include the amplifier 130, which is a stacked structure on the substrate 110 and is configured to amplify light based on a second electrical signal applied thereto.

The amplifier 130 may include a first doped layer 132, a quantum well layer 134, a clad layer 136, and a second doped layer 138, which are sequentially arranged and overlap at least a portion of the phase modulator 120 in the thickness direction of the substrate 110.

The first doped layer 132, the quantum well layer 134, the clad layer 136, and the second doped layer 138 may include a Group III-V compound semiconductor material or a Group II-VI compound semiconductor material. The first doped layer 132, the quantum well layer 134, the clad layer 136, and the second doped layer 138 may be based on indium phosphide (InP) or gallium arsenide (GaAs).

The quantum well layer 134 may be provided for obtaining a medium gain and may have a form in which a plurality of quantum dots are distributed in a well. The quantum well layer 134 may include indium arsenide (InAs), indium gallium arsenide (InGaAs), indium gallium nitrogen arsenide (InGaNAs), indium gallium arsenic phosphide (InGaAsP), indium aluminum gallium arsenide (InAlGaAs), or the like. For example, the well may be $In_xGaAs$ or GaAs, and the composition of the quantum dots may be $In_xGaAs$ (x<x') or InAs.

The clad layer 136 may be a layer for helping the formation of an optical mode having an appropriate size, and may include a semiconductor material having a bandgap greater than that of the quantum well layer 134. For example, the clad layer 136 may include gallium arsenide (GaAs), gallium phosphide (GaP), aluminum gallium arsenide (AlGaAs), indium gallium phosphide (InGaP), or InP. Materials of the quantum well layer 134 and the clad layer 136 may be selected according to the wavelength (energy bandgap) of light to be amplified. For example, when amplifying light having a wavelength of about 1.55 μm, InGaAs/InP may be used for forming the quantum well layer 134 and the clad layer 136.

The first doped layer 132 and the second doped layer 138 may function as electrodes and may be doped with different types of dopants. The clad layer 136 may also be doped with the same type of dopant as that used to dope the second doped layer 138. For example, the first doped layer 132 may be doped with an n-type dopant, and the clad layer 136 and the second doped layer 138 may be doped with a p-type dopant. The n-type dopant may be, for example, phosphorus (P) or arsenic (As), and the p-type dopant may be boron (B).

The width of the amplifier 130 may be greater than the width of the undoped region 122. Thus, light leakage may be reduced when light transmitted through the undoped region 122 travels toward the amplifier 130. For example, the first doped layer 132 may cover the undoped region 122 and the first trench T1 and the second trench T2 in the thickness direction of the substrate 110. The widths of the quantum well layer 134, the clad layer 136, and the second doped layer 138 may be greater than the width of the undoped region 122 but less than the width of the first doped layer 132.

The amplifier 130 may include a third electrode E3 which is in contact with the first doped layer 132, and a fourth electrode E4 which is in contact with the second doped layer 138. The third electrode E3 may be arranged on an upper surface of the first doped layer 132, and the fourth electrode E4 may be arranged on an upper surface of the second doped layer 138. The third electrode E3 and the fourth electrode E4 may also include a conductive material similar to the first electrode E1 and the second electrode E2.

A second electrical signal may be applied through the third electrode E3 and the fourth electrode E4. For example, a second voltage may be applied to the fourth electrode E4, and the third electrode E3 may be grounded. When the second voltage is applied to the fourth electrode E4, an electric charge is supplied to the quantum well layer 134, and thus the density of carriers increases in the quantum well layer 134. Population inversion may be induced in an excited state (ES) by injected current, and thus, stimulated emission of photons may occur due to transition to a ground state (GS), such that the intensity of light traveling through the undoped region 122 may be increased (amplified).

The insulating layer 140 may be further arranged between the phase modulator 120 and the amplifier 130. The insulating layer 140 may prevent a current flow between the phase modulator 120 and the amplifier 130. The insulating layer 140 may be arranged between the first doped layer 132 and the first doped region 124, between the first doped layer 132 and the undoped region 122, and between the first doped layer 132 and the second doped region 126.

The insulating layer 140 may be formed as materials of the undoped region 122 and the phase modulator 120 are naturally oxidized. For example, because the phase modulator 120 is based on a silicon material, the insulating layer 140 may include a silicon oxide. However, embodiments are not limited thereto. In another example, the insulating layer 140 may be formed by depositing an additional insulating material. The insulating layer 140 may include at least one selected from the group consisting of an insulating silicon compound and an insulating metal compound in addition to the silicon oxide. Examples of the insulating silicon compound may include silicon nitride ($Si_xN_y$), silicon oxynitride (SiON), etc., and examples of the insulating metal compound may include aluminum oxide ($Al_2O_3$), hafnium oxide (HfO), zirconium oxide (ZrO), hafnium silicon oxide (HfSiO), titanium oxide $TiO_2$, etc.

For light traveling through the undoped region 122 to be amplified by the quantum well layer 134 of the amplifier 130, the insulating layer 140 may have a small thickness. For example, the thickness of the insulating layer 140 may be about 5 nm to about 20 nm.

As described above, the phase modulator 120 and the amplifier 130 are arranged on the same cross region of the substrate 110, and thus the size of the optical modulating device 100 may be reduced. In addition, because signal-to-noise ratio (SNR) is proportional to the amount of incident light, SNR may be improved using the optical modulating device 100 of the example embodiment which is configured to amplify light and also modulate the phase of the light.

Figures 2, 3:
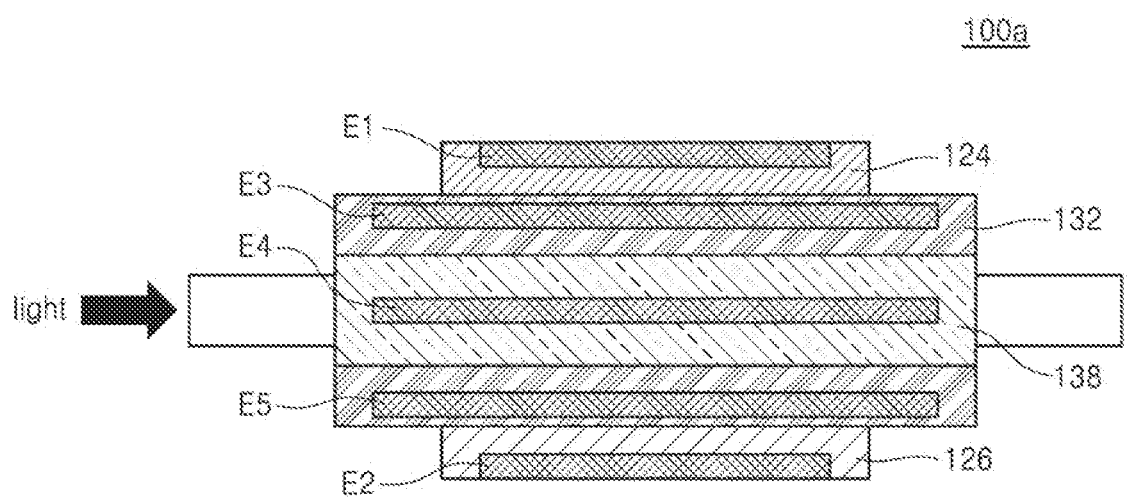
FIG. 2 is a view illustrating results of a simulation in which the signal-to-noise ratio (SNR) of light amplified after phase modulation is simulated as a comparative example, and results of a simulation of the SNR of light output from the optical modulating device of the example embodiment.
FIG. 3 is a view illustrating an optical modulating device according to another example embodiment.

FIG. 2 is a view illustrating results of a simulation in which the SNR of light amplified after being modulated in phase is simulated as a comparative example, and results of a simulation of the SNR of light output from the optical modulating device of the example embodiment. Light having a wavelength of 1310 nm was phase modulated and amplified based on Michael Connelly's SOA modeling.

In the comparative example, light was amplified after modulating the phase of the light. It was assumed that the power of a laser signal reduces from 0.1 mW to 0.05 mW after the phase of the laser signal is modulated. That is, an optical loss caused by phase modulation was assumed to be 3 dB. A signal component having a power of 6.47 mW was output by amplifying the laser signal having a power of 0.05 mW. In this case, in addition to the signal component, amplified noises having a power of 0.54 mW were also output. Thus, the SNR was about 10.8 dB.

A laser signal having a power 0.1 mW was input to the optical modulating device 100 of the example embodiment. A loss by the phase modulator 120 was set to be 3 dB as in the comparative example. As a result, a signal having a power of 6.03 mW was output with noises having a power of 0.26 mW. Thus, the SNR by the optical modulating device 100 of the example embodiment was about 13.7 dB.

Although the signal level output from the optical modulating device 100 of the example embodiment was reduced by 0.3 dB, the noise level output from the optical modulating device 100 of the example embodiment was also reduced by 3.2 dB, and the SNR by the optical modulating device 100 of the example embodiment was higher than that in the comparative example by 2.9 dB. In the comparative example, it may be inferred that because the input signal was reduced, noises were also amplified when the input signal was amplified. In the example embodiment, however, it may be inferred that because a large signal was input to the optical modulating device 100, the amplification of noises was relatively small even when the optical modulating device 100 output the same amplified signal as in the comparative example.

Thus, the optical modulating device 100 of the example embodiment may have a relatively small size while improving SNR.

FIG. 3 is a view illustrating an optical modulating device 100a according to another example embodiment. Comparing FIGS. 1B and 3, a phase modulator and an amplifier may have different lengths. For example, the length of the amplifier may be greater than the length of the phase modulator. In general, the time for amplifying light is longer than the time for modulating the phase of light, and thus, the length of the amplifier may be greater than the length of the phase modulator to guarantee the amplification time.

Figure 4:
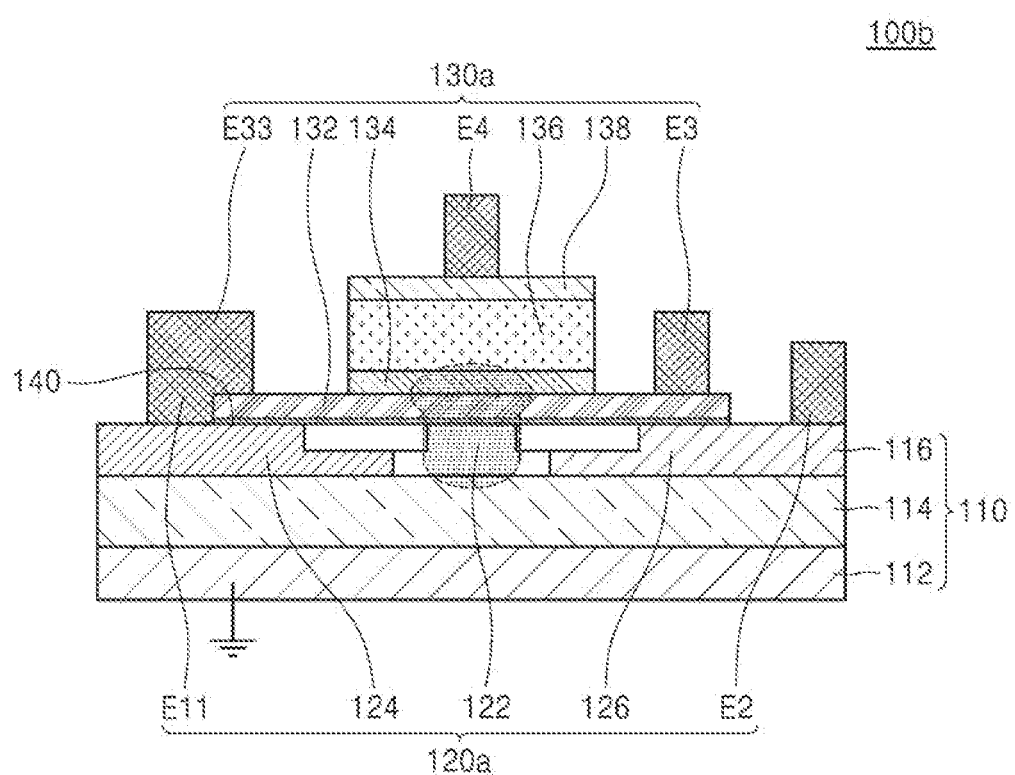
FIG. 4 is a view illustrating an optical modulating device including electrodes formed in one piece according to an example embodiment.

FIG. 4 is a view illustrating an optical modulating device 100b including electrodes formed in one piece according to an example embodiment. Comparing FIGS. 1A and 4, the optical modulating device 100b shown in FIG. 4 may have a first electrode E11 and a third electrode E33, which are integrated. A first voltage may be applied to a second electrode E2, the first electrode E11 may be grounded, a second voltage may be applied to a fourth electrode E4, and the third electrode E33 may be grounded. The optical modulating device 100b may have a relatively simple structure because the grounded first electrode E11 and the third electrode E33 are integrated.

Figure 5:
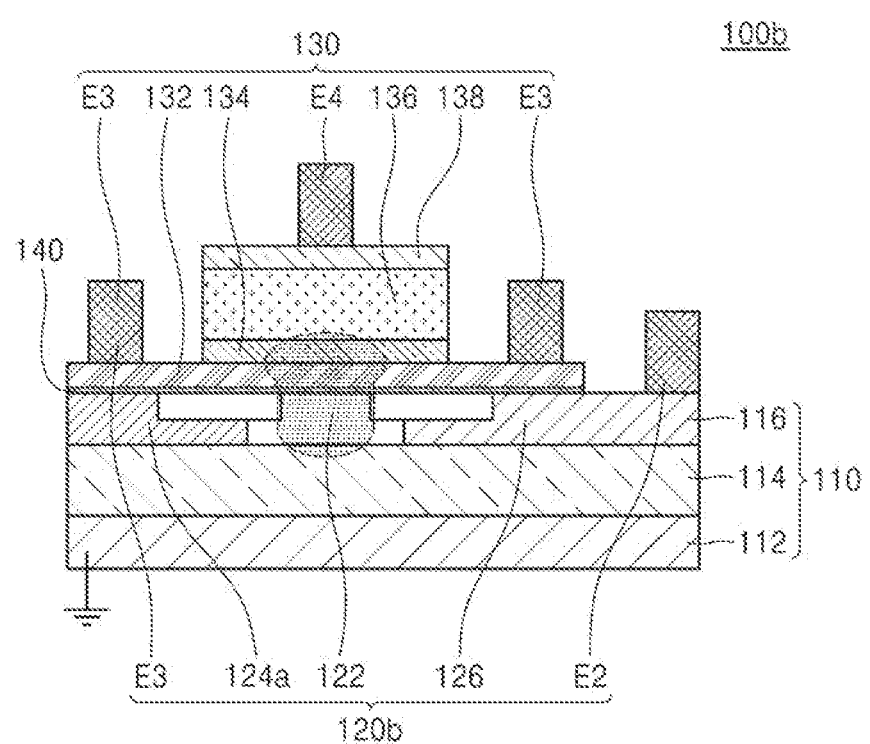
FIG. 5 is a view illustrating an optical modulating device including a capacitor-type amplifier, according to an example embodiment.

FIG. 5 is a view illustrating an optical modulating device 100c including a capacitor-type phase modulator 120b according to an example embodiment. Comparing FIGS. 1A and 5, first doped region 124a and the second doped region 126 of a phase modulator 120b shown in FIG. 5 may be doped with the same dopant. The first doped region 124a and the second doped region 126 may be doped with a type of dopant different from the type of a dopant with which a first doped layer 132 is doped. For example, when the first doped layer 132 is doped with an n-type dopant, the first doped region 124a and the second doped region 126 may be doped with a p-type dopant.

When a voltage is applied to a second electrode E2, an electric field may be formed in the second doped region 126, an undoped region 122, an insulating layer 140, and the first doped layer 132, which are arranged between the second electrode E2 and a third electrode E3, and the charge density of the undoped region 122 may increase due to the accumulation of charge in the undoped region 122, thereby varying the refractive index of the undoped region 122. For example, the phase modulator 120b shown in FIG. 5 may be of a capacitor type. The capacitor-type phase modulator 120b consumes less power than the phase modulator of a PIN or PN diode type.

Figure 6:
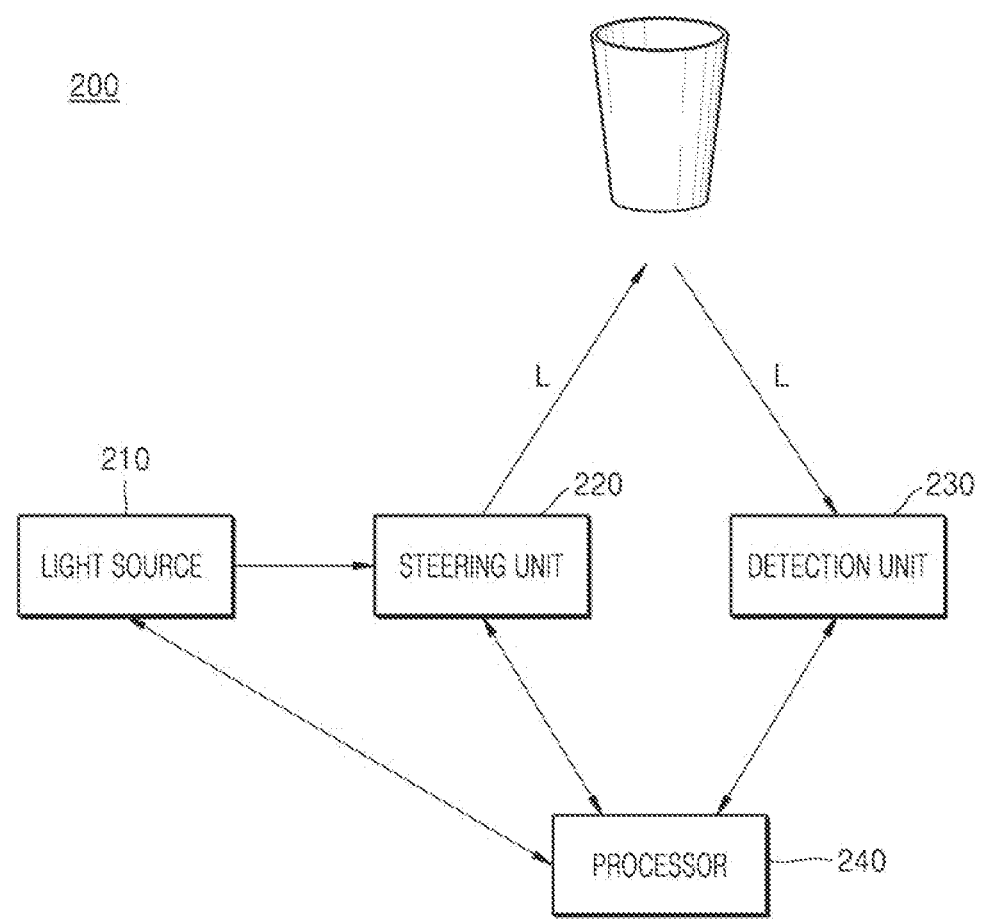
FIG. 6 is a block diagram illustrating a light detection and ranging (LiDAR) apparatus according to an embodiment.

The optical modulating device 100 described above may be used as a beam steering device. FIG. 6 is a block view illustrating a LiDAR apparatus 200 according to an example embodiment.

Referring to FIG. 6, the LiDAR apparatus 200 may include a light source 210 configured to produce light, a steering unit 220 configured to steer light output from the light source 210 toward an object, a detection unit 230 configured to detect light reflected from the object, and a processor 240 configured to perform an operation for obtaining information about the object from the light detected by the detection unit 230.

The light source 210 may output light in a line wavelength band. The light source 210 may be configured to output light in an infrared band to prevent the light from mixing with natural light such as sunlight in a visible band. However, the light source 210 is not limited to emitting light in an infrared band and may be configured to emit light in various wavelength bands.

The light source 210 may include a laser diode (LD), an edge emitting laser, a vertical-cavity surface emitting laser (VCSEL), a distributed feedback laser, a light emitting diode (LED), a super luminescent diode (SLD), or the like.

The light source 210 may generate and output light in a plurality of different wavelength bands. In addition, the light source 210 may generate and output pulsed light or continuous light.

The steering unit 220 is configured to illuminate the object by changing the propagation direction of light output from the light source 210, and may include an optical phased array device configured to adjust the direction of light without mechanical movement.

Figure 7:
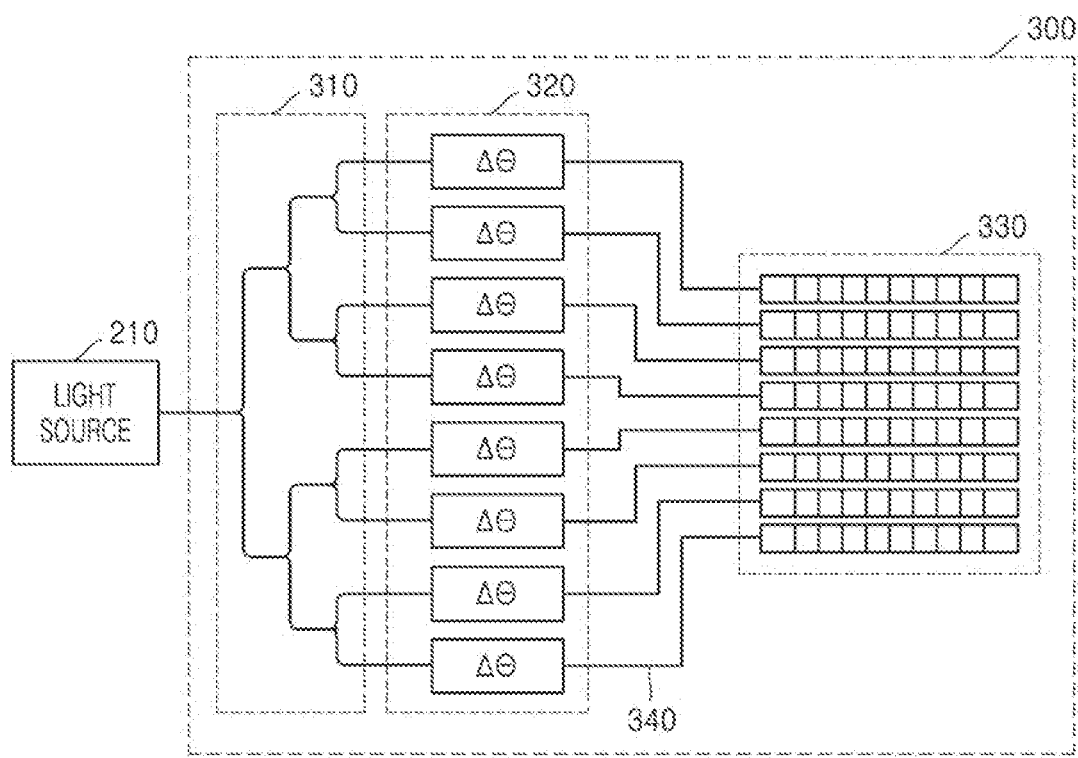
FIG. 7 is a view conceptually illustrating an optical phased array device according to an example embodiment.

FIG. 7 is a view conceptually illustrating an optical phased array device 300 according to an example embodiment. Referring to FIG. 7, the optical phased array device 300 may include an optical splitter 310 configured to distribute incident light into a plurality of sub-light beams, an optical modulating array 320 configured to modulate the phase and magnitude of each of the plurality of sub-light beams, and an antenna array 330 configured to emit the plurality of modulated sub-light beams as modulated light. The optical splitter 310, the optical modulating array 320, and the antenna array 330 may be connected to each other through waveguides.

The optical modulating array 320 may include optical modulating devices such as the optical modulating devices 100, 100a, 100b, and 100c of the example embodiment described above.

As described above, because the optical phased array device 300 is configured to control the direction of light without mechanical movement, a more precise and fast control may be possible using the optical phased array device 300. However, optical loss may occur while light passes through the optical phased array device 300. When the optical modulating array 320 includes optical modulating devices such as the optical modulating device 100, 100a, 100b, or 100c of the example embodiment described above, because the optical modulating devices such as the optical modulating device 100, 100a, 100b, or 100c are configured to perform phase modulation and amplification at the same time, the propagation path of light may be reduced, thereby minimizing optical loss, improving the SNR of light, and reducing the size of the optical phased array device 300.

The detection unit 230 may detect light reflected from the object. The detection unit 230 may include an array of light detection devices. The detection unit 230 may further include a spectroscopic device for analyzing light reflected from the object according to each wavelength of the light.

The processor 240 may perform an operation for obtaining information about the object from the light detected by the detection unit 230. In addition, the processor 240 may manage all processes and control of the LiDAR apparatus 200. The processor 240 may obtain and process information about the object. For example, the processor 240 may acquire and process two-dimensional (2D) or three-dimensional (3D) image information. In addition, driving of the light source 210 and the steering unit 220 or the operation of the detection unit 230 may be generally controlled by the processor 240. For example, the processor 240 may control an electrical signal to be applied to optical modulating devices included in the steering unit 220. The processor 240 may also determine, based on the information obtained from the object, whether to perform user authentication, and may execute other applications.

The light source 210, the steering unit 220, the detection unit 230, and the processor 240 may be implemented as separate devices or as a single device.

3D images obtained by the processor 240 may be transmitted to other units and may be used in the other units. For example, such information may be transmitted to a processor of an autonomous driving apparatus such as an unmanned vehicle or a drone, which employs the LiDAR apparatus 200. In addition, such information may be used in smartphones, cellular phones, personal digital assistants (PDAs), laptops, personal computers (PCs), wearable devices, and other mobile or non-mobile computing devices.

Figure 8:
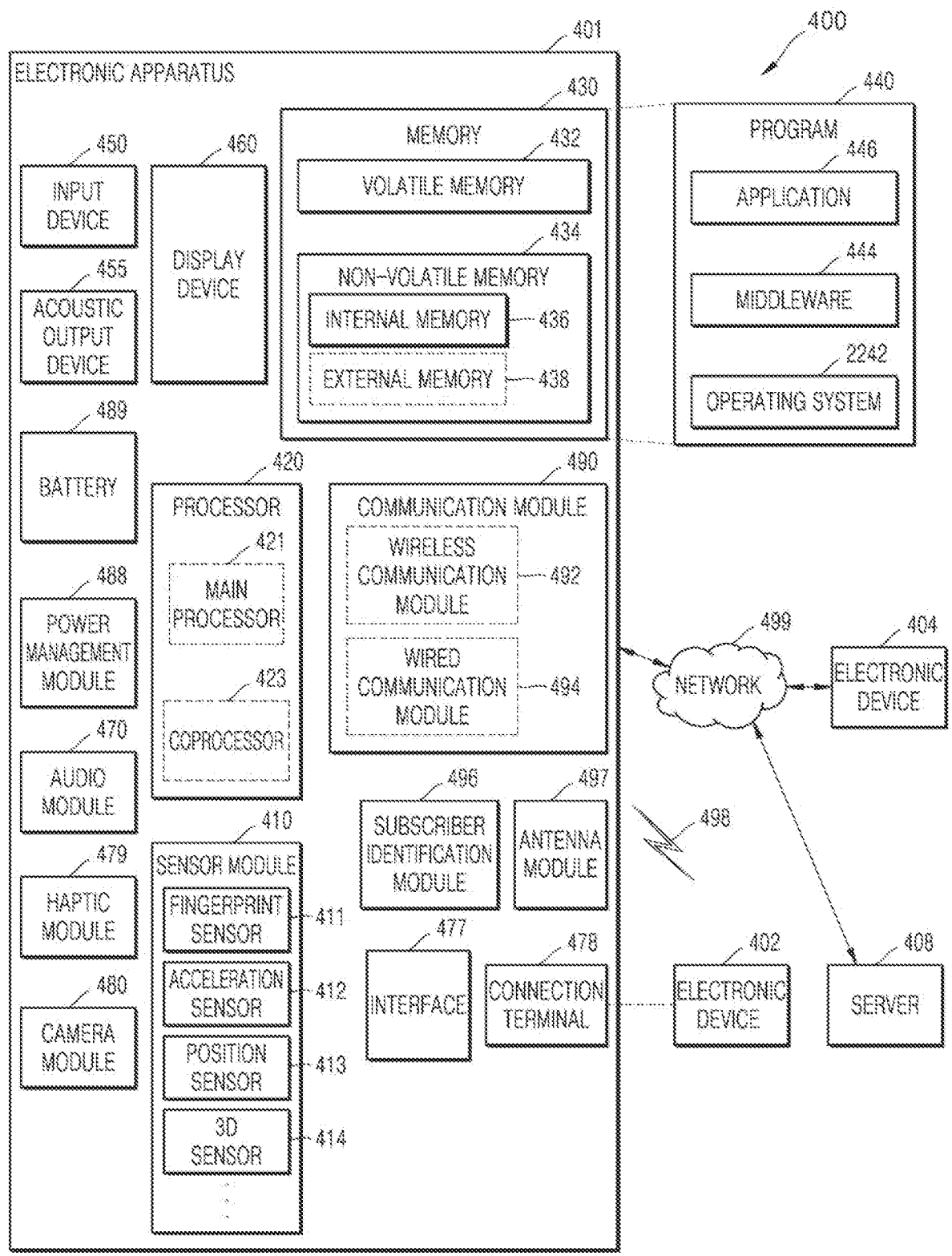
FIG. 8 is a block view illustrating a configuration of an electronic apparatus according to an example embodiment.

FIG. 8 is a block diagram illustrating an electronic apparatus 401 according to an example embodiment.

Referring to FIG. 8, in a network environment, the electronic apparatus 401 may communicate with another electronic apparatus 402 through a first network 498 (such as a short-range wireless communication network) or may communicate with another electronic apparatus 404 and/or a server 408 through a second network 499 (such as a long-range wireless communication network). The electronic apparatus 401 may communicate with the electronic apparatus 404 through the server 408. The electronic apparatus 401 may include a processor 420, a memory 430, an input device 450, a sound output device 455, a display device 460, an audio module 470, a sensor module 410, an interface 477, a haptic module 479, a camera module 480, a power management module 488, a battery 489, a communication module 490, a subscriber identification module 496, and/or an antenna module 497. Some of the components (for example, the display device 460) of the electronic apparatus 401 may be omitted, or other components may be added to the electronic apparatus 401. Some of the components may be implemented as one integrated circuit. For example, a fingerprint sensor 411, an iris sensor, or an illuminance sensor of the sensor module 410 may be embedded in the display device 460 (such as a display).

The processor 420 may execute software (such as a program 440) to control one or more other components (such as hardware or software components) of the electronic apparatus 401 which are connected to the processor 420, and the processor 420 may perform various data processing or operations. As part of data processing or computation, the processor 420 may load commands and/or data received from other components (such as the sensor module 410, the communication module 490, etc.) on a volatile memory 432, process the commands and/or data stored in the volatile memory 432, and store resulting data in a non-volatile memory 434. The processor 420 may include: a main processor 2021 (such as a central processing unit, an application processor, etc.); and a coprocessor 423 (such as a graphics processing unit, an image signal processor, a sensor hub processor, a communication processor, etc.) that may be operated independently or in conjunction with the main processor 2021. The coprocessor 423 may consume less power than the main processor 2021 and may perform a specialized function.

The coprocessor 423 may control functions and/or states related to some of the components (such as the display device 460, the sensor module 410, and the communication module 490) of the electronic apparatus 401, instead of the main processor 2021 while the main processor 2021 is in an inactive state (sleep mode) or together with the main processor 2021 while the main processor 2021 is in an active state (application-execution mode). The coprocessor 423 (such as an image signal processor, a communication processor, etc.) may be implemented as part of a functionally related component (such as the camera module 480 or the communication module 490).

The memory 430 may store various pieces of data required by the components (such as the processor 420, the sensor module 410, etc.) of the electronic apparatus 401. For example, the data may include: software (such as the program 440); and instruction input data and/or output data which are related to the software. The memory 430 may include the volatile memory 432 and/or the non-volatile memory 434.

The program 440 may be stored as software in the memory 430 and may include an operating system 442, middleware 444, and/or an application 446.

The input device 450 may receive, from outside the electronic apparatus 401 (for example, a user), commands and/or data to be used in the components (such as the processor 420) of the electronic apparatus 401. The input device 450 may include a remote controller, a microphone, a mouse, a keyboard, and/or a digital pen (such as a stylus pen).

The sound output device 455 may output a sound signal to the outside of the electronic apparatus 401. The sound output device 455 may include a speaker and/or a receiver. The speaker may be used for general purposes such as multimedia playback or recorded data playback, and the receiver may be used to receive incoming calls. The receiver may be integrated as a part of the speaker or may be implemented as an independent separate device.

The display device 460 may provide information to the outside of the electronic apparatus 401 in a visual manner. The display device 460 may include a device such as a display, a hologram device, or a projector, and a control circuit for controlling the device. The display device 460 may include: touch circuitry configured to detect touches; and/or a sensor circuit (such as a pressure sensor) configured to measure the magnitudes of forces generated by touches.

The audio module 470 may convert a sound into an electric signal or may conversely convert an electric signal into a sound. The audio module 470 may acquire a sound through the input device 450, or may output a sound through the sound output device 455 and/or the speaker and/or headphone of another electronic apparatus (such as the electronic apparatus 402) which are directly or wirelessly connected to the electronic apparatus 401.

The sensor module 410 may detect an operating state (such as the power or the temperature) of the electronic apparatus 401 or an external environmental state (such as a user state) and may generate an electrical signal and/or a data value corresponding to the detected state. The sensor module 410 may include the fingerprint sensor 411, an acceleration sensor 412, a position sensor 413, a 3D sensor 414, and the like. In addition, the sensor module 410 may also include an iris sensor, a gyro sensor, a barometric pressure sensor, a magnetic sensor, a grip sensor, a proximity sensor, a color sensor, an infrared (IR) sensor, a biometric sensor, a temperature sensor, a humidity sensor, and/or an illuminance sensor.

The 3D sensor 414 may emit light toward an object and analyze light reflected from the object to sense the shape of the object, the movement of the object, or the like, and may include the LiDAR apparatus 200 of the embodiment described above.

The interface 477 may support one or more designated protocols that may be used by the electronic apparatus 401 for directly or wirelessly connection with another electronic apparatus (such as the electronic apparatus 402). The interface 477 may include a high-definition multimedia Interface (HDMI), a universal serial bus (USB) interface, a secure digital (SD) card interface, and/or an audio interface.

A connection terminal 478 may include a connector through which the electronic apparatus 401 may be physically connected to another electronic apparatus (such as the electronic apparatus 402). The connection terminal 478 may include an HDMI connector, an USB connector, an SD card connector, and/or an audio connector (such as a headphone connector).

The haptic module 479 may convert an electrical signal into a mechanical stimulus (such as vibration, movement, etc.) or an electrical stimulus that a user may perceive by the tactile or kinesthetic sense. The haptic module 479 may include a motor, a piezoelectric device, and/or an electrical stimulation device.

The camera module 480 may capture still images and moving images. The camera module 480 may include a lens assembly including one or more lenses, image sensors, image signal processors, and/or flashes. The lens assembly of the camera module 480 may collect light coming from a subject to be imaged.

The power management module 488 may manage power supplied to the electronic apparatus 401. The power management module 8388 may be implemented as part of a power management integrated circuit (PMIC).

The battery 489 may supply power to the components of the electronic apparatus 401. The battery 489 may include non-rechargeable primary cells, rechargeable secondary cells, and/or fuel cells.

The communication module 490 may support the establishment of a direct (wired) communication channel and/or a wireless communication channel between the electronic apparatus 401 and another electronic apparatus (such as the electronic apparatus 402, the electronic apparatus 404, or the server 408), and may support communication through the established communication channel. The communication module 490 may include one or more communication processors that operate independently of the processor 420 (such as an application processor) and support direct communication and/or wireless communication. The communication module 490 may include: a wireless communication module 492 (such as a cellular communication module, a short-range wireless communication module, or a global navigation satellite system (GNSS) communication module); and/or a wired communication module 494 (such as a local area network (LAN) communication module or a power line communication module). The communication modules 492 and 494 may communicate with another electronic apparatus through the first network 498 (for example, a short-range communication network such as Bluetooth, WiFi direct, or infrared data association (IrDA)), or the second network 499 (for example, a long-range communication network such as a cellular network, the Internet, or a computer network (LAN, WAN, etc.)). Such various types of communication modules may be integrated into one component (single chip, etc.) or may be implemented as a plurality of components (plural chips) separate from each other. The wireless communication module 492 may identify and authenticate the electronic apparatus 401 in a communication network such as the first network 498 and/or the second network 499 by using subscriber information (such as an international mobile subscriber identifier (IMSI)) stored in the subscriber identification module 496.

The antenna module 497 may transmit or receive signals and/or power to or from the outside (for example, other electronic apparatuses). An antenna may include a radiator which has a conductive pattern formed on a substrate (such as a PCB). The antenna module 497 may include one or a plurality of such antennas. When the antenna module 497 include a plurality of antennas, the communication module 490 may select one of the plurality of antennas which is suitable for a communication method used in a communication network such as the first network 498 and/or the second network 499. Signals and/or power may be transmitted between the communication module 490 and another electronic apparatus through the selected antenna. In addition to the antennas, other components (such as a radio-frequency integrated circuit (RFIC)) may be included as part of the antenna module 497.

Some of the components may be connected to each other and exchange signals (such as commands or data) by an inter-peripheral communication scheme (such as a bus, general purpose input and output (GPIO), serial peripheral interface (SPI), or mobile industry processor interface (MIPI)).

Commands or data may be transmitted between the electronic apparatus 401 and the (external) electronic apparatus 404 through the server 408 connected to the second network 499. The other electronic apparatuses 402 and 404 and the electronic apparatus 401 may be the same type of electronic apparatus or may be different types of electronic apparatuses. All or some of operations of the electronic apparatus 401 may be executed in one or more of the other electronic apparatuses 402 and 404, and the server 408. For example, when the electronic apparatus 401 needs to perform a certain function or service, the electronic apparatus 401 may request one or more other electronic apparatuses to perform a part or all of the function or service instead of performing the function or service by itself. The one or more other electronic apparatuses receiving the request may perform an additional function or service related to the request, and may transmit results thereof to the electronic apparatus 401. To this end, cloud computing, distributed computing, and/or client-server computing techniques may be used.

Figure 9:
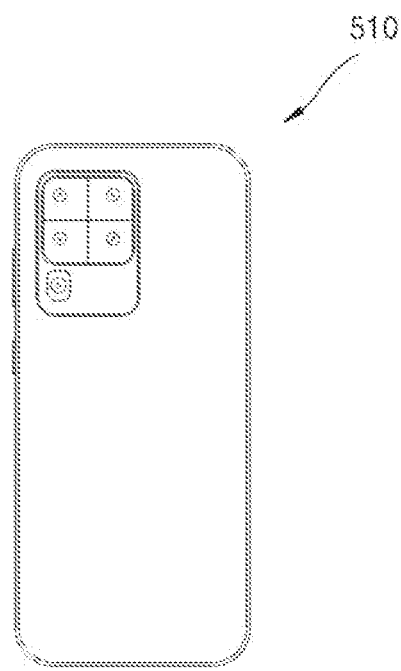
FIGS. 9 to 15 are views illustrating various examples of electronic apparatuses to which object detection devices are applied according to example embodiments.
Figure 10:
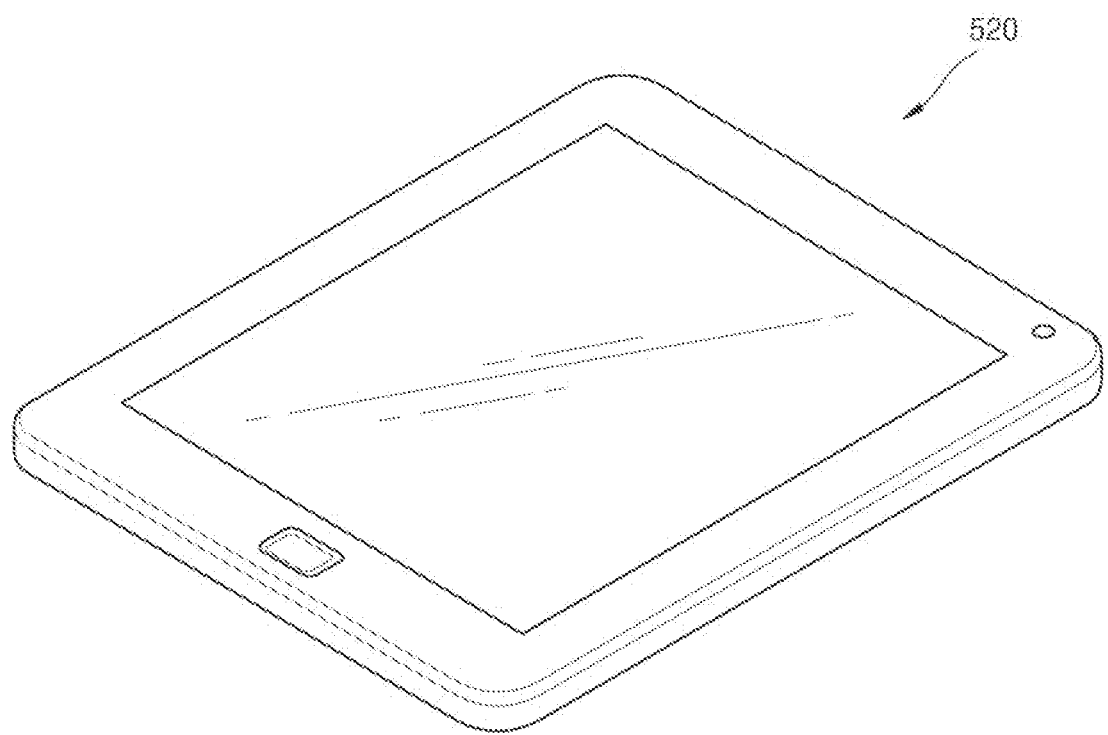
Figure 11:
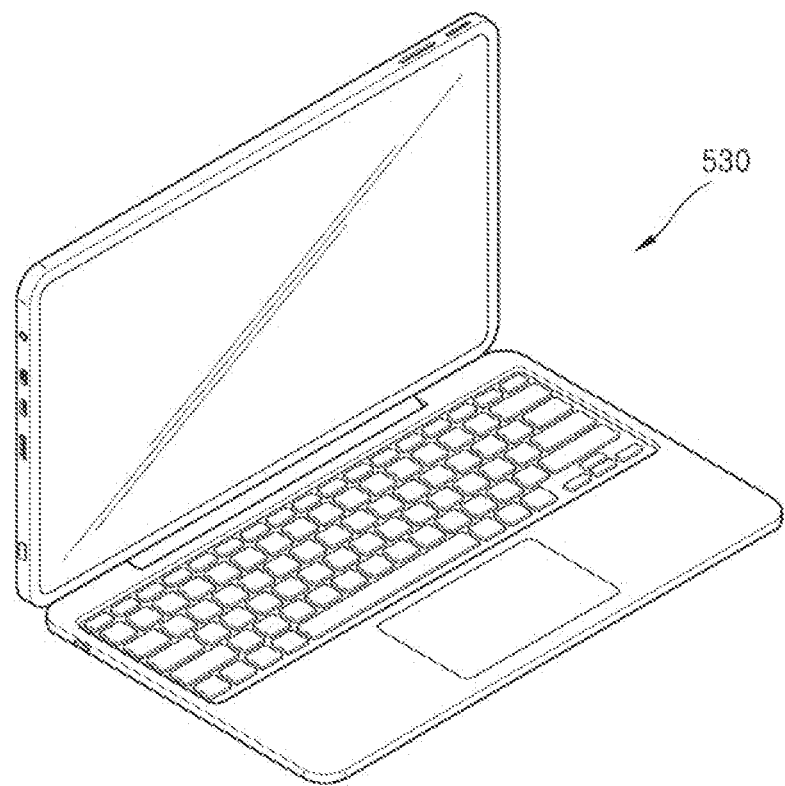

The LiDAR apparatus 200 of the example embodiment described above may be applied to a mobile phone or smartphone 510 shown in FIG. 9, a tablet or smart tablet 520 shown in FIG. 10, a laptop computer 530 shown in FIG. 11, or the like. For example, the smartphone 510 or the smart tablet 520 may use the LiDAR apparatus 200 which is a 3D object sensor to extract object depth information from images, adjust out-of-focus of images, or automatically identify objects in images.

Figure 12:
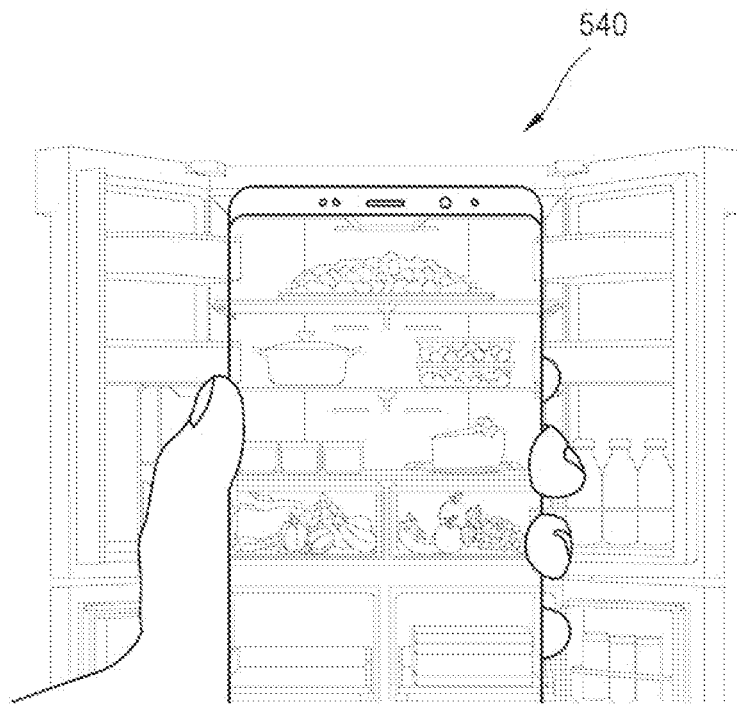
Figure 13:
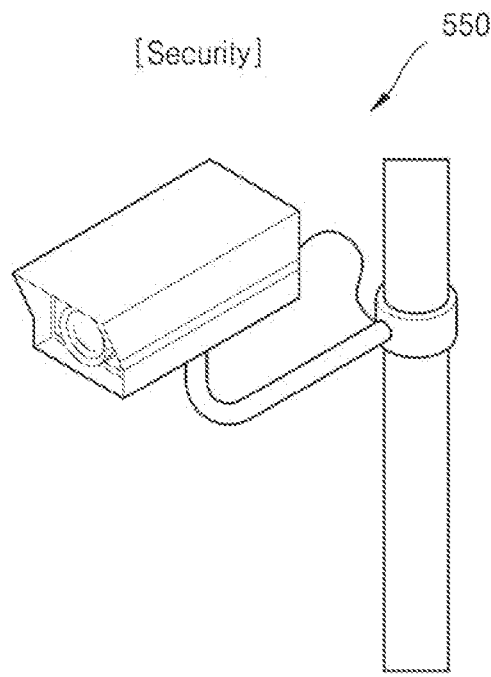
Figure 14:
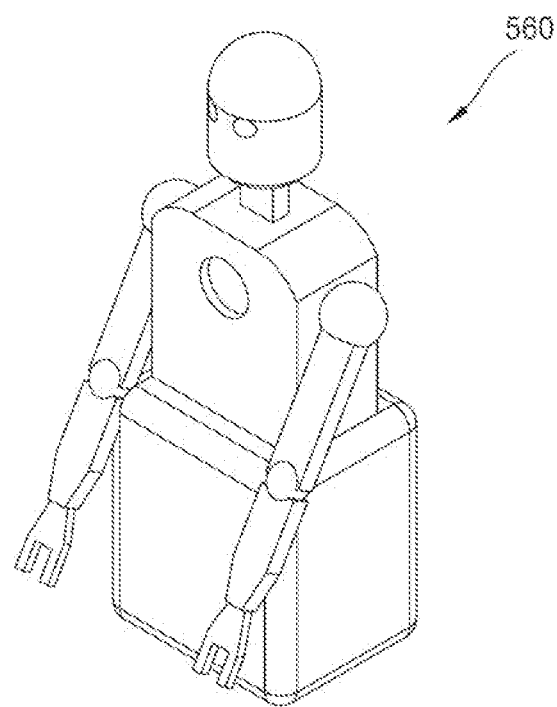

In addition, the LiDAR apparatus 200 may be applied to a smart refrigerator 540 shown in FIG. 12, a security camera 550 shown in FIG. 13, a robot 560 shown in FIG. 14, or the like. For example, the smart refrigerator 540 may automatically recognize foods in a refrigerator using an image sensor and may inform users of the presence of specific foods, the types of foods which are put in or taken out of the refrigerator, and the like through smartphones of the users. The security camera 550 may make it possible to recognize objects or persons in images even in a dark environment. The robot 560 may be sent to a disaster or industrial site, which cannot be directly accessed by people, to provide 3D images of the disaster or industrial site.

Figure 15:
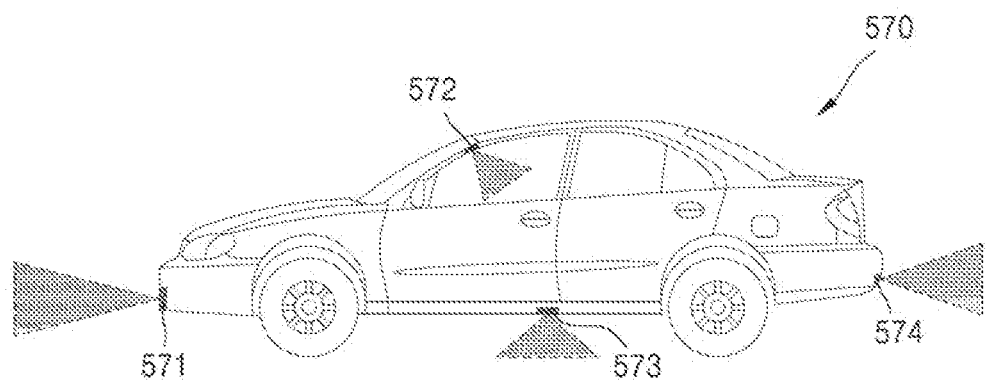

In addition, the LiDAR apparatus 200, which is a 3D sensor, may be applied to a vehicle 570 as shown in FIG. 15.

The vehicle 570 may include a plurality of LiDAR apparatuses 571, 572, 573, and 574 arranged at various positions. The vehicle 570 may provide a driver with various pieces of information about the interior or surroundings of the vehicle 570 using the LiDAR apparatuses 571, 572, 573, and 574, and may automatically recognize objects or people in images to provide information necessary for autonomous driving.

As described above, according to the one or more of the above example embodiments, the optical modulating device and the apparatus including the optical modulating device may reduce optical loss by simultaneously performing phase modulation and amplification.

According to the one or more of the above example embodiments, the optical modulating device and the apparatus including the optical modulating device may improve SNR by simultaneously performing phase modulation and amplification.

According to the one or more of the above example embodiments, the optical modulating device and the apparatus including the optical modulating device may have small sizes owing to the structure in which the phase modulator and the amplifier overlap each other in the thickness direction of the substrate.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An optical modulating device comprising:
   a substrate comprising a first trench and a second trench which are spaced apart from each other;
   a phase modulator provided in a region of the substrate, the phase modulator comprising:
      an undoped region which is provided between the first trench and the second trench, and is not doped with a dopant; and
      a first doped region and a second doped region which are spaced apart from each other with the undoped region therebetween, and are doped with a dopant,
      wherein the phase modulator is configured to modulate a phase of light traveling through the undoped region based on a first electrical signal applied to the phase modulator;
   an amplifier comprising a first doped layer, a quantum well layer, a clad layer, and a second doped layer which are sequentially provided on the substrate, the amplifier overlapping at least a portion of the phase modulator in a thickness direction of the substrate and being configured to amplify the light based on a second electrical signal applied to the amplifier; and
   an insulating layer provided between the phase modulator and the amplifier.

2. The optical modulating device of claim 1, wherein the phase modulator and the amplifier are respectively configured to modulate the phase of the light based on the first electrical signal and amplify the light based on the second electrical signal simultaneously.

3. The optical modulating device of claim 1, wherein the amplifier entirely overlaps the phase modulator in the thickness direction of the substrate.

4. The optical modulating device of claim 1, wherein the first doped layer covers the first trench, the undoped region, and the second trench.

5. The optical modulating device of claim 1, wherein the insulating layer is provided between the first doped layer and the first doped region, between the first doped layer and the second doped region, and between the first doped layer and the undoped region.

6. The optical modulating device of claim 1, wherein the insulating layer comprises a silicon oxide.

7. The optical modulating device of claim 1, wherein a width of the quantum well layer, a width of the clad layer, and a width of the second doped layer are greater than a width of the undoped region.

8. The optical modulating device of claim 1, wherein a width of the quantum well layer, a width of the clad layer, and a width of the second doped layer are less than a width of the first doped layer.

9. The optical modulating device of claim 1, wherein the first doped layer, the clad layer, the quantum well layer, and the second doped layer comprise a Group III-V semiconductor compound.

10. The optical modulating device of claim 1, further comprising:
    a first electrode contacting the first doped region;
    a second electrode contacting the second doped region;
    a third electrode contacting the first doped layer; and
    a fourth electrode contacting the second doped layer.

11. The optical modulating device of claim 10, wherein the first electrical signal is applied through the first electrode and the second electrode, and the second electrical signal is applied through the third electrode and the fourth electrode.

12. The optical modulating device of claim 10, wherein the first electrode and the third electrode are integrated.

13. The optical modulating device of claim 10, wherein the first electrode and the third electrode are grounded.

14. The optical modulating device of claim 1, wherein a length of the phase modulator is different from a length of the amplifier.

15. The optical modulating device of claim 1, wherein a length of the phase modulator is less than a length of the amplifier.

16. The optical modulating device of claim 1, wherein the first doped region and the second doped region are doped with different types of dopants.

17. The optical modulating device of claim 1, wherein the first doped region and the second doped region are doped with one type of dopant.

18. The optical modulating device of claim 1, wherein the first doped layer is doped with a first type of dopant different from a second type of dopant with which at least one of the first doped region and the second doped region is doped.

19. The optical modulating device of claim 1, wherein the optical modulating device has a signal-to-noise ratio that is greater than or equal to 12 dB.

20. An optical steering apparatus comprising:
    an optical splitter configured to split input light into a plurality of sub-light beams;
    a plurality of optical modulating devices configured to modulate at least one of a phase and a magnitude of each of the plurality of sub-light beams output from the optical splitter; and an antenna array configured to output, as light having directivity, the plurality of modulated sub-light beams output from the plurality of optical modulating devices, wherein at least one of the plurality of optical modulating devices comprises:

a substrate comprising a first trench and a second trench which are spaced apart from each other;

a phase modulator provided in a region of the substrate, the phase modulator comprising:

an undoped region which is provided between the first trench and the second trench, and is not doped with a dopant; and a first doped region and a second doped region which are spaced apart from each other with the undoped region therebetween and are doped with a dopant, wherein the phase modulator is configured to modulate a phase of light traveling through the undoped region based on a first electrical signal applied to the phase modulator;

an amplifier provided on the substrate and overlapping at least a portion of the phase modulator in a thickness direction of the substrate, the amplifier being configured to amplify the light based on a second electrical signal applied to the amplifier; and an insulating layer configured to prevent a flow of current between the phase modulator and the amplifier.

21. The optical steering apparatus of claim 20, wherein the amplifier comprises a first doped layer, a quantum well layer, a clad layer, and a second doped layer, which are sequentially provided on the substrate and overlap at least a portion of the phase modulator in the thickness direction of the substrate.

22. The optical steering apparatus of claim 20, wherein the phase modulator and the amplifier are respectively configured to modulate the phase of the light based on the first electrical signal and amplify the light based on the second electrical signal simultaneously.

23. The optical steering apparatus of claim 20, wherein the amplifier entirely overlaps the phase modulator in the thickness direction of the substrate.

* * * * *